US012625158B2

(12) United States Patent
Li et al.

(10) Patent No.: US 12,625,158 B2
(45) Date of Patent: May 12, 2026

(54) METHOD AND DEVICE FOR DETECTING STATE OF DOOR OR WINDOW

(71) Applicant: Robert Bosch GmbH, Stuttgart (DE)

(72) Inventors: SHangru Li, Suzhou (CN); Dan Liu, Suzhou (CN); Haibo Qin, Suzhou (CN)

(73) Assignee: Robert Bosch GmbH, Stuttgart (DE)

( * ) Notice: Subject to any disclaimer, the term of this patent is extended or adjusted under 35 U.S.C. 154(b) by 436 days.

(21) Appl. No.: 18/018,119

(22) PCT Filed: Jul. 1, 2021

(86) PCT No.: PCT/EP2021/068233
§ 371 (c)(1),
(2) Date: Jan. 26, 2023

(87) PCT Pub. No.: WO2022/022943
PCT Pub. Date: Feb. 3, 2022

(65) Prior Publication Data
US 2023/0280367 A1 Sep. 7, 2023

(30) Foreign Application Priority Data

Jul. 31, 2020 (CN) .......................... 202010764652.8

(51) Int. Cl.
*G01P 15/08* (2006.01)
*G01B 7/30* (2006.01)
(Continued)

(52) U.S. Cl.
CPC ............ *G01P 15/0888* (2013.01); *G01B 7/30* (2013.01); *G01P 3/44* (2013.01); *G01P 13/00* (2013.01); *G01R 29/0814* (2013.01)

(58) Field of Classification Search
CPC .................................................. G01P 15/0888
See application file for complete search history.

(56) References Cited

U.S. PATENT DOCUMENTS 6,496,779 B1 * 12/2002 Hwang .............. G01C 21/1654
73/488
9,885,588 B2 * 2/2018 Misfatto ................. E05B 39/00
(Continued)

FOREIGN PATENT DOCUMENTS

CN 107462148 A * 12/2017 .............. G01B 7/30
CN 111121705 A 5/2020
DE 20 2017 101 608 U1 6/2017

OTHER PUBLICATIONS

International Search Report corresponding to PCT Application No. PCT/EP2021/068233, mailed Oct. 1, 2021 (English language document) (3 pages).

*Primary Examiner* — John Fitzgerald
(74) *Attorney, Agent, or Firm* — Maginot, Moore & Beck LLP

(57) ABSTRACT

A method for detecting a state of a door or window is provided, comprising: receiving sensor data from a sensor arranged on the door or window, the sensor data comprising magnetometer data and at least one of angular velocity data and acceleration data; judging whether magnetic field distortion is present on the basis of the sensor data; and when it is judged that the magnetic field distortion is not present, determining the state of the door or window on the basis of the magnetometer data. The accuracy of state detection is thereby increased.

12 Claims, 5 Drawing Sheets

(51) Int. Cl.
　　*G01P 3/44*　　　　(2006.01)
　　*G01P 13/00*　　　(2006.01)
　　*G01R 29/08*　　　(2006.01)

(56)　　　　　　　　References Cited

U.S. PATENT DOCUMENTS

| | | | | |
|---|---|---|---|---|
| 9,953,503 | B2 * | 4/2018 | Smith | G08B 13/02 |
| 10,012,669 | B2 * | 7/2018 | Scheiermann | G01P 15/18 |
| 10,074,248 | B2 * | 9/2018 | Modi | G08B 5/36 |
| 10,127,785 | B2 * | 11/2018 | Peterson | G08B 25/001 |
| 10,401,138 | B2 * | 9/2019 | Modi | G01B 7/14 |
| 11,603,698 | B2 * | 3/2023 | Battlogg | E05F 15/79 |
| 11,873,671 | B2 * | 1/2024 | Battlogg | E05F 15/40 |
| 12,066,241 | B2 * | 8/2024 | Blackmore | G01R 33/0029 |
| 2003/0071739 | A1 * | 4/2003 | Addy | G08B 13/2491 |
| | | | | 340/568.1 |
| 2010/0019902 | A1 * | 1/2010 | Mullet | G08B 13/08 |
| | | | | 340/546 |
| 2015/0330140 | A1 | 11/2015 | Kincaid et al. | |
| 2016/0189508 | A1 * | 6/2016 | Peterson | G08B 25/001 |
| | | | | 340/547 |
| 2016/0231349 | A1 * | 8/2016 | Scheiermann | G08B 13/08 |
| 2018/0089969 | A1 * | 3/2018 | Modi | G08B 5/36 |
| 2018/0225938 | A1 * | 8/2018 | Peterson | G08B 25/008 |
| 2019/0211619 | A1 * | 7/2019 | Kincaid | G08B 13/08 |
| 2020/0264019 | A1 * | 8/2020 | Kathan et al. | G01D 5/12 |
| 2023/0125619 | A1 * | 4/2023 | Li | G08B 21/24 |
| | | | | 340/5.7 |
| 2023/0280367 | A1 * | 9/2023 | Li | G01P 13/00 |
| | | | | 73/514.02 |

* cited by examiner

METHOD AND DEVICE FOR DETECTING STATE OF DOOR OR WINDOW

This application is a 35 U.S.C. § 371 National Stage Application of PCT/EP2021/068233, filed on Jul. 1, 2021, which claims the benefit of priority to Serial No. CN 202010764652.8, filed on Jul. 31, 2020 in China, the disclosures of which are incorporated herein by reference in their entirety.

The present disclosure relates to the technical field of doors and windows, in particular to door or window detection.

BACKGROUND

As society advances, an ever growing number of detection methods are being used in our everyday lives, to provide convenience and safety for our lives, for example in the detection of the state of doors or windows, especially the state of opening/closing, or even the provision of the opening angle of doors or windows. Common detection methods include detection based on angular velocity data and detection based on magnetometer data.

In a detection method based on angular velocity data, angular velocity data is integrated to calculate the opening angle of a door or window, and the state of the door or window is then detected on the basis of the calculated opening angle. Angular velocity data measured by an angular velocity sensor generally includes deviation which will increase with time, possibly resulting in deviation of the calculated opening angle from the actual value.

In a detection method based on magnetometer data, the detection environment is required to be magnetically stable, but in real situations, magnetic field distortion is often present in the detection environment, so it is difficult to guarantee the magnetic stability thereof.

SUMMARY

It is hoped to provide a method and device for detecting a state of a door or window; the method and device first detect whether magnetic field distortion is present, and perform detection on the basis of magnetometer data only if no magnetic distortion is present, thereby increasing the accuracy of the detection result.

According to one aspect, a method for detecting a state of a door or window is provided. The method comprises: receiving sensor data from a sensor arranged on the door or window, the sensor data comprising magnetometer data and at least one of angular velocity data and acceleration data; judging whether magnetic field distortion is present on the basis of the sensor data; and when it is judged that the magnetic field distortion is not present, determining the state of the door or window on the basis of the magnetometer data.

According to another aspect, a device for detecting a state of a door or window is provided. The device comprises: a receiving unit, for receiving sensor data from a sensor arranged on the door or window, the sensor data comprising magnetometer data and at least one of angular velocity data and acceleration data; a judgment unit, for judging whether magnetic field distortion is present on the basis of the sensor data; and a state determining unit, for determining the state of the door or window on the basis of the magnetometer data when it is judged that the magnetic field distortion is not present.

According to another aspect, a system for detecting a state of a door of window is provided, comprising: an acceleration sensor, an angular velocity sensor and a magnetometer installed on the door or window; and a processor, for performing the method according to any one of various embodiments.

According to another aspect, a machine readable storage medium is provided, storing a computer program instruction which, when run, causes a computer to perform the method according to various embodiments of the present disclosure.

According to various embodiments of various aspects of the present disclosure, first of all, a judgment is made as to whether magnetic field distortion is present on the basis of sensor data; in particular, a judgment is first made as to whether the door or window is in a stationary state, and different approaches are used for a stationary state and a non-stationary state to judge whether magnetic field distortion is present. If it is judged that no magnetic field distortion is present, the state of the door or window, in particular the door open/closed state or even the angle of door opening, is determined on the basis of magnetometer data. This increases the accuracy of the detection result.

BRIEF DESCRIPTION OF THE DRAWINGS

In the drawings, embodiments are explained merely by demonstration, in a non-limiting way. Similar reference labels in the drawings denote similar elements.

Figure 1:
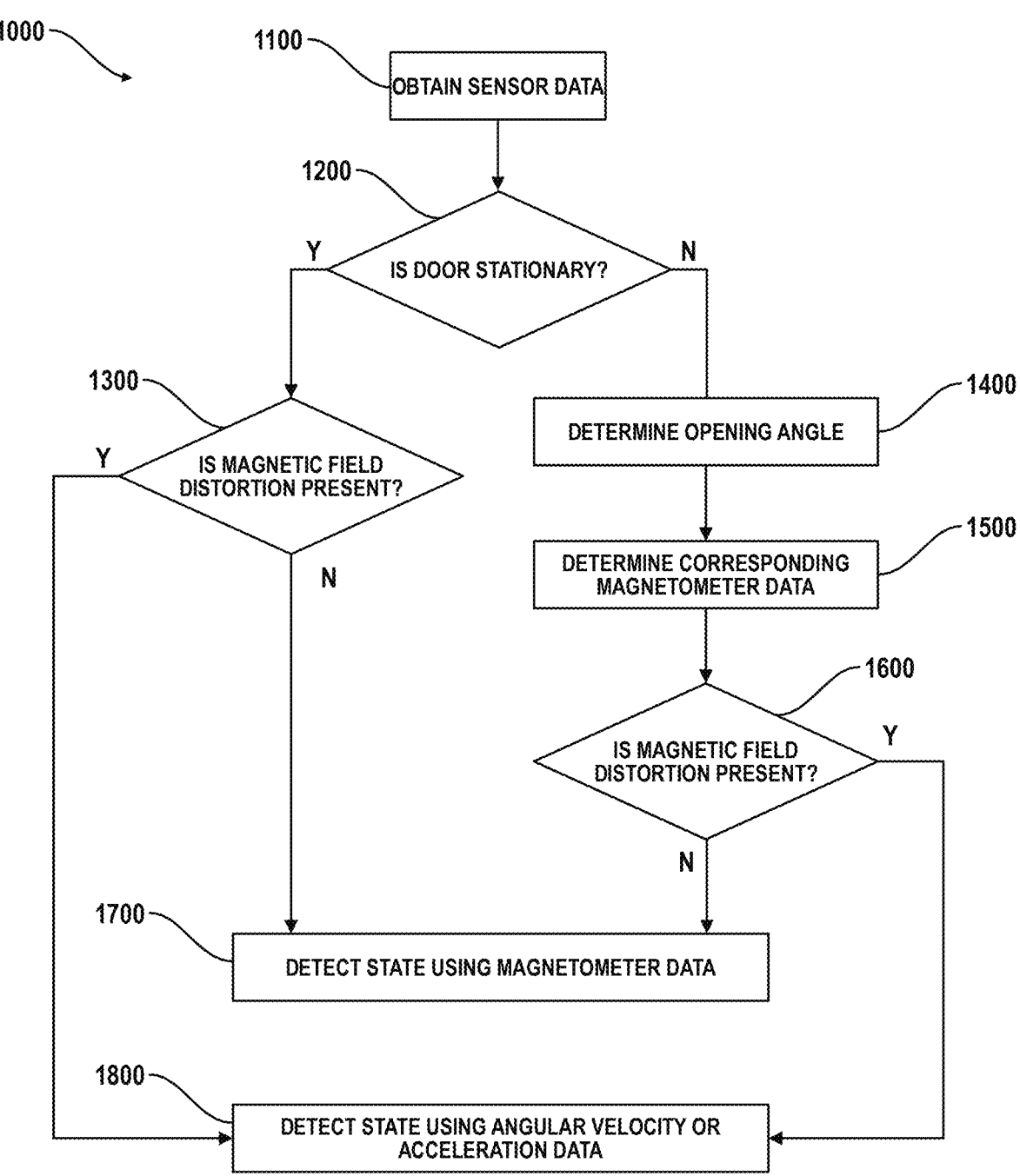
FIG. 1 shows a method for detecting a state of a door or window according to one embodiment.

Various aspects and features of various embodiments of the present disclosure are described with reference to the drawings mentioned above. The drawings are merely schematic, not restrictive. The sizes, shapes, labels or appearance of various elements in the drawings can vary without departing from the substance of the present disclosure, rather than being limited to those shown in the drawings.

DETAILED DESCRIPTION

According to various embodiments of various aspects of the present disclosure, after first detecting whether magnetic field distortion is present, magnetometer data is used to determine the state of a door or window if no magnetic field distortion is present. Specifically, a judgment is first made as to whether the door or window is in a stationary state, and different methods are used for a stationary state and a non-stationary state to judge whether magnetometer data is measured in the presence of magnetic field distortion; when it is judged that no magnetic field distortion is present, the detection of the state of the door or window on the basis of magnetometer data is initiated, i.e. the state of the door or window is determined on the basis of the magnetometer data. The ensures the accuracy of determination of the state of the door or window on the basis of magnetometer data. Furthermore, the use of different methods for stationary and non-stationary states to judge magnetic field distortion enables more accurate judgment of magnetic field distortion, thus increasing the accuracy of state detection.

Further, when it is judged that magnetic field distortion is present, detection of the state of the door or window on the basis of angular velocity data is initiated, in particular taking into account angular velocity deviation data of the door or window and an initial opening angle of the door or window to calculate the opening angle of the door or window, so as to perform state detection. This enables an accurate detection result to be obtained even when magnetic field distortion is present.

Further, in the process of state detection, the angular velocity deviation data and the initial opening angle of the door or window can be suitably updated; for example, the angular velocity deviation data is updated when it is judged that the door or window is stationary for a predetermined time period, and/or the initial opening angle is updated when it is judged that the door or window is stationary and there is no magnetic field distortion, and when it is determined that the door or window is closed, respectively. This avoids inaccuracy of detection caused by drift/deviation in angular velocity data, increasing the accuracy of detection of the state of the door or window on the basis of angular velocity.

FIG. 1 shows a method 1000 for detecting a state of a door or window according to one embodiment. According to the method 1000, in step 1100, sensor data from the door or window is obtained. The sensor data may be measured by an inertial sensor unit installed in a door lock. The inertial sensor unit comprises an acceleration sensor that is preferably a three-axis sensor, an angular velocity sensor and a magnetometer. Correspondingly, the sensor data comprises acceleration data, angular velocity data and magnetometer data. In some embodiments, acceleration data can be ignored. Thus, only an angular velocity sensor and a magnetometer are provided in the door lock.

In step 1200, a judgment is made as to whether the door or window is stationary on the basis of the sensor data. In one embodiment, a judgment as to whether the door or window is stationary can be made by determining the stability of sensor data. Specifically, a judgment as to whether the door or window is stationary can be made solely on the basis of any one of acceleration data, angular velocity data and magnetometer data. It is also possible to combine two or three of these to judge whether the door or window is stationary, so as to increase the accuracy of judgment.

In the case where a judgment is made solely on the basis of magnetometer data, it is possible to determine data, e.g. standard deviation, indicating variation in magnetometer data collected within a predetermined time period such as 1 second; if the data indicating variation is less than a predetermined threshold, then the corresponding magnetometer data is relatively stable, and this indicates that the door or window is stationary; otherwise, it is indicated that the door or window is not stationary.

In the case where a judgment is made solely on the basis of angular velocity data, taking into account the fact that there is deviation in angular velocity data, angular velocity deviation data is subtracted from the angular velocity data and then a judgment is made as to whether the door or window is stationary on the basis of the data so obtained. Initially, the angular velocity deviation data is obtained according to the mean value of measured angular velocity data, with the door or window kept stationary for a predetermined time period (e.g. 1 second). Subsequently, when it is determined that the door or window is stationary for a predetermined time period, the angular velocity deviation data can be updated on the basis of angular velocity data in the predetermined time period.

Specifically, when the door is stationary, ideally, angular velocity data about any axis should be zero. It is possible to judge whether the door or window is currently stationary by determining the divergence of the current angular velocity data from zero. If the divergence is too great, this indicates that the door or window is not stationary; if the divergence meets a predetermined requirement, this indicates that the door or window is stationary.

For example, data indicating the divergence of the current angular velocity data from zero is obtained by finding the sum of squares of angular velocity data for each axis at the current moment, and then taking the square root of the sum of squares. The data indicating divergence is compared with a predetermined threshold, and if it is less than the threshold, the door or window is judged to be stationary, otherwise it is indicated that the door or window is not stationary. Deviation in angular velocity data is preferably taken into account when setting the predetermined threshold.

In another example, when angular velocity deviation data is taken into account, the following formula can be used to determine data D indicating the divergence of the current angular velocity data from zero.

$$D=\sqrt{(Gx-Ox)^2+(Gy-Oy)^2+(Gz-Oz)^2}$$

where Gx, Gy and Gz are angular velocity data about x, y and z axes respectively, and Ox, Oy and Oz are angular velocity deviation data about the x, y and z axes respectively. The x, y and z axes are three mutually perpendicular coordinate axes defined with respect to the door. The data D is compared with a predetermined threshold to judge whether the door or window is stationary. In this example, the predetermined threshold can be set as a relatively small value, with no need to further take into account the amount of deviation in angular velocity data.

In the case where a judgment is made solely on the basis of acceleration data, when the door or window is stationary, variation in the acceleration data thereof should ideally be zero. Variation data of the acceleration data (e.g. range of variation and/or standard deviation) is compared with a predetermined threshold to judge whether the door or window is stationary.

To increase the accuracy of judgment, it is possible to judge whether multiple consecutive angular velocity data or acceleration data meet the abovementioned requirement. For example, when it is determined that the divergences of multiple angular velocity data or acceleration data from zero within a predetermined time period (e.g. 1 second) all meet the requirement, the door or window is judged to be stationary.

If it is judged in step 1200 that the door or window is stationary (i.e. "Y" in the figure), then the method advances to step 1300. In step 1300, based on magnetometer data, stability data of magnetometer data within the predetermined time period for which the door or window is stationary is determined, and then based on the determined stability data, a judgment is made as to whether magnetic field distortion is present. For example, the standard deviation of collected magnetometer data is determined and compared with a predetermined threshold, and if the standard deviation is larger in comparison, this indicates that magnetic field distortion is present; otherwise, it is indicated that no magnetic field distortion is present.

If a determination is made as to whether the door or window is stationary solely on the basis of magnetometer data in step 1200, then it is possible for step 1200 and step 1300 to be combined. However, in view of the fact that magnetic field distortion might be present, in step 1200 a determination is made as to whether the door or window is stationary on the basis of angular velocity data and/or acceleration data.

If it is judged in step 1300 that no magnetic field distortion is present (i.e. "N" in the figure), then the method advances to step 1700, in which detection of the state of the door or window on the basis of magnetometer data is initiated, i.e. the state of the door or window is determined on the basis of magnetometer data. Specifically, the state of the door or window is determined on the basis of magnetometer data and a predetermined correspondence between magnetometer data and the opening angle of the door or window. This will be described in detail below with reference to FIG. 3. If it is judged in step 1300 that magnetic field distortion is present (i.e. "Y" in the figure), then the method advances to step 1800, in which detection of the state of the door or window on the basis of angular velocity data and/or acceleration data is initiated. In one embodiment, detection of the state of the door or window on the basis of angular velocity data is initiated. When detection of the state of the door or window is performed on the basis of angular velocity data, angular velocity deviation data is taken into account; in particular, the current opening angle of the door or window is calculated on the basis of the measured/received angular velocity data, angular velocity deviation data and initial opening angle of the door or window, and the state of the door or window is thereby determined. When calculating the current opening angle of the door or window, calculation is generally performed by integrating angular velocity data on the basis of the initial opening angle of the door or window, wherein the angular velocity data may be angular velocity data from which angular velocity deviation data has been subtracted. The initial opening angle may be initially set to zero in an initialization process as described below, and may also be updated as described below to the angle at which the door is positioned each time the door is stationary or closed, thereby updating the integration basis for calculating the next door or window opening angle, to obtain a more accurate detection result for the state of the door or window.

If it is judged in step 1200 that the door or window is not stationary (i.e. "N" in the figure), then the method advances to step 1400. In step 1400, one or more opening angle of the door or window is determined on the basis of angular velocity data and/or acceleration data. When one or more opening angle of the door or window is determined on the basis of angular velocity data, angular velocity deviation data may first be subtracted from the angular velocity data, then one or more current opening angle may be determined on the basis of the angular velocity data so obtained and an initial opening angle of the door or window. Next, in step 1500, magnetometer data corresponding to each opening angle is determined. Thus, in steps 1400 and 1500, a correspondence between magnetometer data and the opening angle of the door or window for the current sensor data is obtained.

Next, in step 1600, the correspondence obtained in steps 1400 and 1500 is compared with a predetermined correspondence; in particular, a judgment is made as to whether the magnetic field distortion is present on the basis of one or more opening angle and corresponding magnetometer data determined for the one or more opening angle, which were determined in steps 1400 and 1500, and the predetermined correspondence, wherein the predetermined correspondence is a predetermined correspondence between each opening angle and corresponding magnetometer data determined for the door or window in the absence of magnetic field distortion. The predetermined correspondence may be stored in the form of a table, being initially set when the device for detecting the state of the door or window is installed, and possibly being updated.

Figure 2:
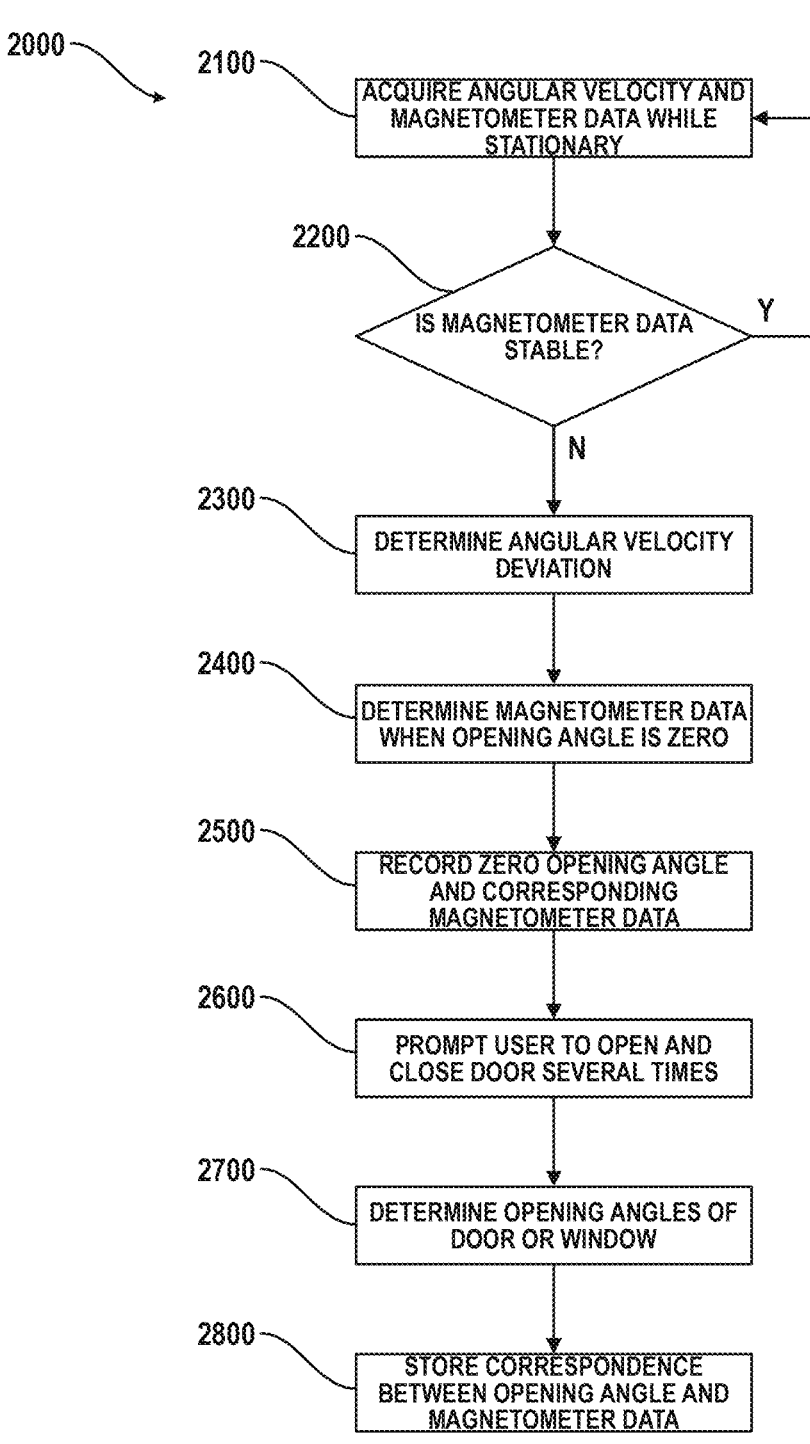
FIG. 2 shows a method for setting a predetermined correspondence according to one embodiment.

FIG. 2 shows a method 2000 for setting the predetermined correspondence according to one embodiment. According to the method 2000, in step 2100, angular velocity data and magnetometer data for a predetermined time period (e.g. 5 seconds) measured while keeping the door or window stationary are acquired. In step 2200, based on the magnetometer data within the predetermined time period for which the door or window is stationary, the stability thereof is judged; for example, a determination is made as to whether standard deviation data among the magnetometer data is too large. If it is judged in step 2200 that the magnetometer data within the predetermined time period is not stable, this indicates that magnetic field distortion is present (i.e. "Y" in the figure), in which case an alert can be outputted to indicate to a user that magnetic field distortion is currently present, and the method can then return to step 2100, in which angular velocity data and magnetometer data for a new predetermined time period are obtained while keeping the door or window stationary.

If it is judged in step 2200 that the magnetometer data within the predetermined time period is stable, i.e. no magnetic field distortion is present (i.e. "N" in the figure), then the method advances to step 2300. In this step, initial angular velocity deviation data for the door or window is determined on the basis of the angular velocity data within the predetermined time period, e.g. by finding the mean value of the angular velocity data within the predetermined time period. The angular velocity deviation data can be updated when it is subsequently determined that the door or window is stationary for a predetermined time period.

Next, in step 2400, based on the magnetometer data within the predetermined time period, e.g. by finding the mean value of the magnetometer data within the predetermined time period, magnetometer data when the opening angle of the door or window is zero is determined.

In step 2500, the opening angle of the door or window being zero and the corresponding magnetometer data are recorded.

Further, in step 2600, the user is prompted to repeatedly open and close the door several times at a normal speed, at the same time obtaining measured angular velocity data and corresponding magnetometer data.

In step 2700, based on the angular velocity data measured in step 2600, the initial angular velocity deviation data determined in step 2300 and an initial opening angle of the door or window (which can be zero), opening angles of the door or window in the process of being opened and closed are determined.

In step 2800, the determined opening angles of the door or window in the process of being opened and closed and corresponding magnetometer data are stored in a corresponding fashion in a predetermined table for example, thereby obtaining the abovementioned predetermined correspondence between each opening angle and corresponding magnetometer data. It will be understood that for repeated opening and closing of the door several times, a predetermined correspondence for each time the door is opened and closed can be obtained, and a more accurate result can be obtained by finding the average of corresponding data in these predetermined correspondences.

Although the process of setting the predetermined correspondence has been described above with reference to FIG. 2, it will be understood that this process can be repeated in predetermined circumstances (e.g. periodically), in order to update the abovementioned predetermined correspondence.

Returning to FIG. 1, specifically, in step 1600, the magnetometer data determined in step 1500 for one or more opening angle determined in step 1400 is compared with magnetometer data in the predetermined correspondence that corresponds to the one or more opening angle, and if first difference data between the magnetometer data determined for the one or more opening angle and the magnetometer data in the predetermined correspondence that corresponds to the one or more opening angle is too large, e.g. larger than a predetermined threshold, this indicates that magnetic field distortion is present; otherwise, if the first difference data meets a predetermined requirement, e.g. is smaller than or equal to a predetermined threshold, this indicates that magnetic field distortion is not present.

In another embodiment, in step 1600, one or more opening angle determined in step 1400 is compared with a corresponding opening angle in the predetermined correspondence that corresponds to the magnetometer data determined in step 1500 for the one or more opening angle, and if second difference data between the one or more opening angle and the corresponding opening angle in the predetermined correspondence that corresponds to the magnetometer data determined for the one or more opening angle is too large, e.g. larger than a predetermined threshold, this indicates that magnetic field distortion is present; otherwise, if the second difference data meets a predetermined requirement, e.g. is smaller than or equal to a predetermined threshold, this indicates that magnetic field distortion is not present.

If it is determined in step 1600 that magnetic field distortion is not present (i.e. "N" in the figure), then the method advances to step 1700, in which detection of the state of the door or window on the basis of magnetometer data is initiated, i.e. the state of the door or window is determined on the basis of magnetometer data. If it is judged in step 1600 that magnetic field distortion is present (i.e. "Y" in the figure), then the method advances to step 1800, in which detection of the state of the door or window on the basis of angular velocity data and/or acceleration data is initiated. Preferably, when detection of the state of the door or window is performed on the basis of angular velocity data, angular velocity deviation data is taken into account; in particular, one or more current opening angle of the door or window is calculated on the basis of the measured/received angular velocity data, angular velocity deviation data (which can be initial angular velocity deviation data or updated angular velocity deviation data) and initial opening angle of the door or window, and the state of the door or window is thereby determined.

Figure 3:
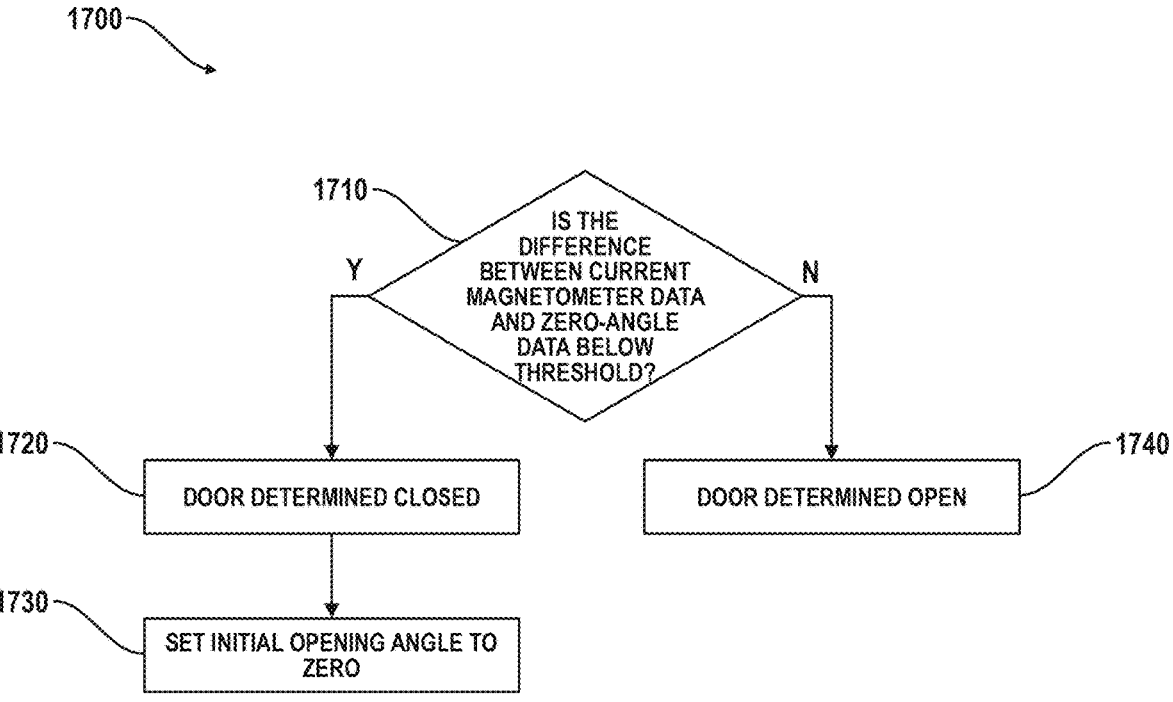
FIG. 3 shows a method for detecting a state of a door or window on the basis of magnetometer data according to one embodiment.

FIG. 3 shows a method for detecting the state of the door or window on the basis of magnetometer data in step 1700 according to one embodiment. According to the method, in step 1710, the current magnetometer data is compared with magnetometer data in the predetermined correspondence that corresponds to a door opening angle of zero, to determine whether the difference therebetween meets a requirement, e.g. whether it is smaller than a predetermined threshold, and if it is not smaller than the predetermined threshold (i.e. "N" in the figure), then the method advances to step 1740; in step 1740, the current state of the door is determined as being open. Otherwise, the method advances to step 1720; in step 1720, the current state of the door is determined as being closed.

In a preferred embodiment, after determining in step 1720 that the current state of the door is closed, the method can advance further to step 1730. In step 1730, an initial opening angle of the door or window is set to zero. Thus, on the next occasion that the current opening angle of the door or window is calculated on the basis of the measured/received angular velocity data, angular velocity deviation data and initial opening angle of the door or window, an updated initial opening angle can be used. In view of the fact that deviation in angular velocity sensor data will increase with time, by setting afresh an initial opening angle that is closer in time, it is possible to obtain a more accurate opening angle of the door or window on the next occasion that the opening angle of the door or window is calculated on the basis of angular velocity data.

A description has been given above, with reference to step 1730, of the action of updating to zero the initial opening angle of the door or window that is used for calculating the opening angle of the door or window on the basis of angular velocity data, but this is not restrictive; it can also be anticipated that the initial opening angle be updated if it is determined that the door or window is in a stationary state (in particular, stationary at a current opening angle greater than zero) and no magnetic field distortion is present. Preferably, the initial opening angle is updated if it is determined that the door or angle is in a stationary state within a predetermined time period (e.g. 3 seconds) and no magnetic field distortion is present. This updating process is based on the current opening angle, current magnetometer data and predetermined correspondence that are calculated according to the current angular velocity data, angular velocity deviation data and initial opening angle.

For example, referring to FIG. 1, after judging in step 1200 that the door or window is stationary and judging in step 1300 that no magnetic field distortion is present, in addition to advancing to step 1700 it is also possible to perform in parallel a process of updating the initial opening angle (not shown). Alternatively, it is possible to first perform a process of updating the initial opening angle before step 1710 shown in FIG. 3, and then advance to comparing the current magnetometer data with magnetometer data in the predetermined correspondence that corresponds to a door opening angle of zero in step 1710. Alternatively, the process of updating the initial opening angle can be performed in parallel with steps 1710-1740.

Specifically, according to the process of updating the initial opening angle, when it is judged that the door or window is stationary and no magnetic field distortion is present, magnetometer data is more reliable, whereas errors might occur in angular velocity data due to deviation. In this state, if there is no deviation in angular velocity data, then current magnetometer data corresponding to one opening angle or a current opening angle corresponding to one magnetometer datum should ideally be the same as magnetometer data corresponding to the same opening angle, or an opening angle corresponding to the same magnetometer datum, in the predetermined relationship.

Thus, in one embodiment, first of all, the current opening angle of the door or window is calculated on the basis of angular velocity data, angular velocity deviation data and initial opening angle of the door or window, and this might include errors arising from deviation. Next, a corresponding opening angle for the current magnetometer data is determined on the basis of the abovementioned predetermined correspondence; the calculated current opening angle is compared with the determined corresponding opening angle; if the difference value therebetween exceeds a predetermined angle, this indicates that the error arising from deviation in the angular velocity data is too large, therefore the initial opening angle of the door or window is set to be equal to the corresponding opening angle determined according to the predetermined correspondence. Thus, the initial opening angle is updated, and the error arising from deviation in angular velocity data is reduced.

In another embodiment, after determining the current opening angle, corresponding magnetometer data for the current opening angle is determined on the basis of the abovementioned predetermined correspondence, the corresponding magnetometer data is compared with current magnetometer data, and if the difference value therebetween exceeds a predetermined threshold, this indicates that the error arising from deviation in angular velocity data is too large; thus, a corresponding opening angle for the current magnetometer data is further determined on the basis of the abovementioned predetermined correspondence, and the initial opening angle of the door or window is set to be equal to the corresponding opening angle.

As stated above, the initial opening angle is updated if it is judged that the door or window is closed or in any stationary state and no magnetic field distortion is present, and the updated initial opening angle can be used as a basis for angular velocity data integration when subsequently calculating the opening angle of the door or window, thereby reducing the error arising from deviation. Especially when it is subsequently necessary to calculate the opening angle on the basis of angular velocity data, including initiating the detection of the state of the door or window on the basis of angular velocity data, a more accurate detection result is obtained.

Figure 4:
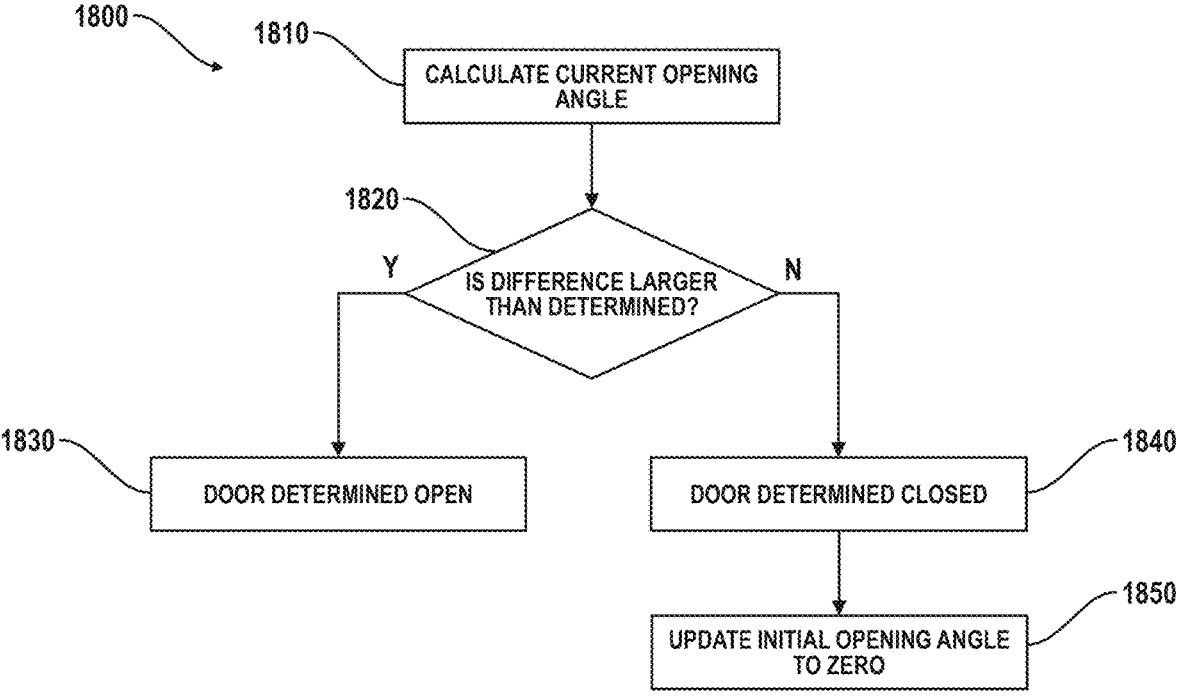
FIG. 4 shows a method for detecting a state of a door or window on the basis of angular velocity data according to one embodiment.

FIG. 4 shows a method for detecting the state of the door or window on the basis of angular velocity data in step 1800, according to one embodiment. According to the method, in step 1810, one or more current opening angle of the door or window is first calculated on the basis of angular velocity deviation data, the initial opening angle of the door or window, and angular velocity data coming from the angular velocity sensor within a predetermined time period (e.g. 1 second). If the opening angle of the door or window has already been calculated in a previous step (e.g. step 1400), this step can be omitted. In step 1820, the difference between the calculated opening angle in the predetermined time period and zero is determined, and if the difference is too large, e.g. larger than a predetermined angle (e.g. 1 degree), then the door or window is determined as being open in step 1830, otherwise the door or window is determined as being closed in step 1840. After step 1840, the initial opening angle of the door or window used for subsequent opening angle calculation can further be updated to zero, as described above, in step 1850.

A description has been given above, with reference to different situations, of how to update the initial opening angle when the door or window is judged to be stationary; it can also be anticipated that angular velocity deviation data be updated after judging that the door or window is stationary (at any angle) for a predetermined time period (e.g. 1 second). For example, angular velocity deviation data is updated on the basis of angular velocity data measured within a predetermined time period when the door or window is stationary, e.g. the mean value thereof is used to replace the original angular velocity deviation data. A more accurate calculation result is thereby obtained when the opening angle of the door or window is subsequently calculated.

By updating the initial opening angle and angular velocity deviation data, it is possible to overcome drift/deviation in angular velocity data, and thereby improve the accuracy of calculation of the opening angle of the door or window on the basis of angular velocity data.

Methods for determining the state of a door or window according to various embodiments of the present disclosure have been described above with reference to FIGS. 1-4; as long as the spirit of the technical solution of the present disclosure is not departed from, various steps therein can be combined/split/reorganized/amended, to obtain corresponding results.

For example, a description has been given above, with reference to steps 1200-1600 in FIG. 1, of a method in which a determination is first made as to whether a door or window is stationary, and then different approaches are used for the cases where the door or window is in a stationary or non-stationary state to determine whether magnetic field distortion is present; however, this is not restrictive, and it is also possible to determine whether magnetic field distortion is present without distinguishing between stationary and non-stationary states of the door or window.

Figure 5:
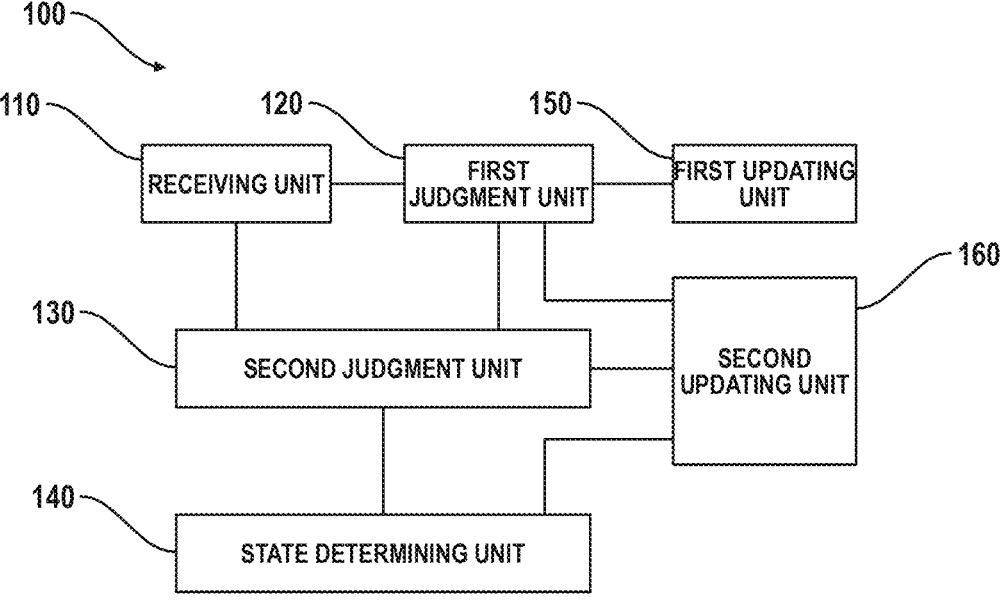
FIG. 5 shows a device for detecting a state of a door or window according to one embodiment.

FIG. 5 shows a device 100 for determining a state of a door or window according to one embodiment. The device 100 comprises a receiving unit 110, a first judgment unit 120 a second judgment unit 130, a state determining unit 140, a first updating unit 150 and a second updating unit 160. The first judgment unit 120 and second judgment unit 130 together form a judgment unit.

The receiving unit 110 receives sensor data of a door or window, the sensor data comprising magnetometer data, angular velocity data and acceleration data. The first judgment unit 120 judges whether the door or window is stationary on the basis of the sensor data. When the first judgment unit 120 judges that the door or window is stationary, the second judgment unit 130 judges whether magnetic field distortion is present on the basis of the magnetometer data. When the first judgment unit 120 judges that the door or window is not stationary, the second judgment unit 130 determines one or more opening angle of the door or window on the basis of the angular velocity data or the acceleration data, determines magnetometer data for the one or more opening angle, and judges whether the magnetic field distortion is present on the basis of the one or more opening angle and corresponding magnetometer data, and a predetermined correspondence between each opening angle of the door or window and corresponding magnetometer data, the predetermined correspondence being determined in the absence of the magnetic field distortion. Preferably, the one or more opening angle is determined on the basis of the angular velocity data, angular velocity deviation data and the initial opening angle of the door or window.

When the second judgment unit 130 judges that the magnetic field distortion is not present, the state determining unit 140 determines the state of the door or window on the basis of the magnetometer data and the predetermined correspondence. In one embodiment, when the second judgment unit 130 judges that the magnetic field distortion is present, the state determining unit 140 determines the state of the door or window on the basis of the angular velocity data, angular velocity deviation data and the initial opening angle of the door or window. When it is judged that the magnetic field distortion is present, it is also possible for the state determining unit 140 to determine the state of the door or window on the basis of acceleration data.

In a preferred embodiment, when the first judgment unit 120 judges that the door or window is stationary at a current opening angle greater than zero and the second judgment unit 130 judges that the magnetic field distortion is not present, the initial opening angle of the door or window is updated. This updating is based on the current opening angle, corresponding magnetometer data and the predetermined correspondence. The current opening angle may be calculated from the current angular velocity data, angular velocity deviation data and the initial opening angle.

In a further embodiment, when state detection on the basis of magnetometer data is performed, the state determining unit 140 determines the difference between the magnetometer data and magnetometer data in the predetermined correspondence that corresponds to an opening angle of zero; and determines whether the door or window is closed on the basis of the difference.

In contrast, when state detection on the basis of angular velocity data is performed, the state determining unit 140 determines one or more opening angle of the door or window on the basis of the angular velocity data, angular velocity deviation data and initial opening angle of the door or window; and determines whether the door or window is closed on the basis of the one or more opening angle, in particular on the basis of a comparison of the one or more opening angle with zero.

Further, when the first judgment unit judges that the door or window is stationary for a predetermined time period, the first updating unit 150 updates the angular velocity deviation data on the basis of angular velocity data within the predetermined time period. When the state determining unit 140 determines that the door or window is closed, the second updating unit 160 sets the initial opening angle of the door or window to zero. The updated angular velocity deviation data can be used by the first judgment unit 120, the second judgment unit 130 and the state determining unit 140. The updated initial opening angle can be used by the second judgment unit 130 and the state determining unit 140.

The predetermined time period, predetermined angle and predetermined threshold have been described above with reference to different applications and scenarios; as will be understood, the values thereof may be different in different scenarios, but it could also be envisaged that the values thereof are the same in different scenarios. They may be set by a user as required.

Various embodiments of the method and device for detecting the state of a door or window have been described above with reference to FIGS. 1-5; these embodiments can be combined to obtain different effects, without being restricted by the type of subject matter. Furthermore, the various units/steps/processes mentioned above are not restrictive, and the functions of the various units/steps/processes can be merged/combined/changed/amended to obtain corresponding effects. The functions of these units can be realized by software or corresponding hardware, or realized with the aid of a processor; for example, the processor can read computer programs in a memory, and run these computer programs to realize the functions of the various units.

Specifically, the functions of the device for detecting the state of a door or window can be realized in a microcontroller of a smart lock for a door or window, or can be realized at a remote position relative to the door or window. An inertial sensor, in particular an acceleration sensor, an angular velocity sensor and a magnetometer, is installed in a lock of the door or window in order to perform detection. In the case of remote processing, sensor data can be sent to a corresponding remote position. The various sensors installed on the door or window and the device for detecting the state of the door or window as shown in FIG. 5 together form a system for detecting the state of the door or window.

As will be understood, the method and device for detecting the state of a door or window in various embodiments of the present disclosure can be implemented by a computer program/software. The software can be loaded into an operating memory of a data processor, and when run, is used to perform the method according to the embodiments of the present disclosure.

Demonstrative embodiments of the present disclosure cover the following two scenarios: creating/using the computer program/software of the present disclosure from the beginning, and switching an existing program/software to use of the computer program/software of the present disclosure by means of an update.

According to another embodiment of the present disclosure, a machine (e.g. computer) readable medium is provided, such as a CD-ROM, wherein the readable medium has computer program code stored thereon, and the computer program code, when executed, causes a computer or processor to perform the method according to the embodiments of the present disclosure. The machine readable medium is for example an optical storage medium or solid-state medium supplied with other hardware or as part of other hardware.

The computer program for performing the method according to the embodiments of the present disclosure may also be released in another form, e.g. via the internet or another wired or wireless telecommunications system.

The computer program may also be provided on a network such as the world wide web, and can be downloaded from such a network into an operating computer of a data processor.

It must be pointed out that the embodiments of the present disclosure are described with reference to different subject matters. In particular, some embodiments are described with reference to method-type claims, whereas other embodiments are described with reference to device-type claims. However, those skilled in the art will appreciate from the descriptions above and below that unless otherwise stated, in addition to any combination of features of subject matter of one type, any combination of features relating to different subject matters is also regarded as being disclosed in the present application. Moreover, all features can be combined to provide a synergistic effect greater than the simple sum of features.

Specific embodiments of the present disclosure have been described above. Other embodiments are within the scope of the attached claims. In some cases, actions or steps recorded in the claims may be performed in a different order from that in the embodiments, and still achieve the desired result. In addition, the processes depicted in the figures do not necessarily require the specific order or consecutive order shown in order to achieve the desired result. In some embodiments, multi-task processing and parallel processing are also possible, or might be advantageous.

The present disclosure has been described above with reference to specific embodiments, but those skilled in the art should understand that the technical solution of the present disclosure can be realized in various ways without deviating from the spirit and basic features of the present disclosure. Particular embodiments are merely schematic, not restrictive. In addition, these embodiments may be combined in any way to achieve the object of the present disclosure. The scope of protection of the present disclosure is defined by the attached claims.

The word "comprises" in the specification and claims does not rule out the existence of other elements or steps, and expressions such as "first", "second" and "step" and the sequence of the various steps shown in the figures do not define the order thereof, and do not define the number. The functions of the various elements described in the specification or recorded in the claims may also be split or combined, and realized by corresponding multiple elements or a corresponding single element.

The invention claimed is:

1. A method for detecting a state of a door or window, comprising:

receiving sensor data from at least one sensor arranged on the door or window, the sensor data comprising magnetometer data and at least one of angular velocity data and acceleration data;

judging whether magnetic field distortion is present in a detection environment of the at least one sensor based on the sensor data;

when it is judged that the magnetic field distortion is not present, determining the state of the door or window based on the magnetometer data; and when it is judged that the magnetic field distortion is present, determining the state of the door or window based on the at least one of the angular velocity data and the acceleration data, wherein the method is implemented in a non-transitory machine-readable storage medium that stores computer program instructions which, when run, causes a processor to perform the method, wherein:

the judging of whether magnetic field distortion is present based on the sensor data comprises:

judging whether the door or window is stationary based on the sensor data;

when it is judged that the door or window is stationary, judging whether magnetic field distortion is present based on the magnetometer data;

when it is judged that the door or window is not stationary:

determining one or more opening angle of the door or window based on the at least one of the angular velocity data and the acceleration data;

determining magnetometer data for the one or more opening angle; and judging whether the magnetic field distortion is present based on the one or more opening angle, the magnetometer data determined for the one or more opening angle, and a predetermined correspondence between each opening angle of the door or window and corresponding magnetometer data, the predetermined correspondence being determined in the absence of the magnetic field distortion; and when it is judged that the magnetic field distortion is not present, the state of the door or window is determined based on the magnetometer data and the predetermined correspondence.

2. The method as claimed in claim 1, wherein the judging of whether the magnetic field distortion is present based on the one or more opening angle, the magnetometer data determined for the one or more opening angle, and a predetermined correspondence between each opening angle of the door or window and corresponding magnetometer data, comprises one of:

determining first difference data between the magnetometer data determined for the one or more opening angle and magnetometer data in the predetermined correspondence that corresponds to the one or more opening angle, and determining whether magnetic field distortion is present based on the first difference data; and determining second difference data between the one or more opening angle and a corresponding opening angle in the predetermined correspondence that corresponds to the magnetometer data determined for the one or more opening angle; and determining whether magnetic field distortion is present based on the second difference data.

3. The method as claimed in claim 1, wherein:

the one or more opening angle is determined based on the angular velocity data, angular velocity deviation data, and an initial opening angle of the door or window, and when it is judged that the magnetic field distortion is present, determining the state of the door or window based on the angular velocity data, the angular velocity deviation data, and the initial opening angle of the door or window.

4. The method as claimed in claim 3, further comprising:

when it is judged that the door or window is stationary at a current opening angle greater than zero and the magnetic field distortion is not present, updating the initial opening angle of the door or window.

5. The method as claimed in claim 3, wherein the determining the state of the door or window based on the angular velocity data, the angular velocity deviation data, and the initial opening angle of the door or window comprises:

determining the one or more opening angle of the door or window based on the angular velocity data, the angular velocity deviation data, and the initial opening angle of the door or window; and determining whether the door or window is closed based on the one or more opening angle.

6. The method as claimed in claim 3, further comprising:

when it is judged that the door or window is stationary for a predetermined time period, updating the angular velocity deviation data based on angular velocity data within the predetermined time period.

7. The method as claimed in claim 3, wherein the determining the state of the door or window based on the magnetometer data and the predetermined correspondence comprises:

determining a difference between the magnetometer data and magnetometer data in the predetermined correspondence that corresponds to an opening angle of zero; and determining whether the door or window is closed based on the difference.

8. The method as claimed in claim 7, further comprising:

when it is determined that the door or window is closed, setting the initial opening angle of the door or window to zero.

9. A device for detecting a state of a door or window, comprising:

a non-transitory machine readable storage medium configured to store computer program instructions; and a processor configured to execute the computer program instructions, the processor comprising:

a receiving unit configured to receive sensor data from at least one sensor arranged on the door or window, the sensor data comprising magnetometer data and at least one of angular velocity data and acceleration data;

a judgment unit configured to judge whether magnetic field distortion is present in a detection environment of the at least one sensor based on the sensor data; and a state determining unit configured to:

when it is judged that the magnetic field distortion is not present, determine the state of the door or window based on the magnetometer data; and when it is judged that the magnetic field distortion is present, determine the state of the door or window based on the at least one of the angular velocity and the acceleration data, wherein the judgment unit comprises:

a first judgment unit configured to judge whether the door or window is stationary based on the sensor data; and a second judgment unit configured to:

when the first judgment unit judges that the door or window is stationary, judge whether magnetic field distortion is present based on the magnetometer data; and when the first judgment unit judges that the door or window is not stationary:

determine one or more opening angle of the door or window based on the at least one of the angular velocity data and the acceleration data;

determine magnetometer data for the one or more opening angle; and judge whether the magnetic field distortion is present based on the one or more opening angle, corresponding magnetometer data, and a predetermined correspondence between each opening angle of the door or window and corresponding magnetometer data, the predetermined correspondence being determined in the absence of the magnetic field distortion, and wherein the state determining unit is configured to determine the state of the door or window based on the magnetometer data and the predetermined correspondence when the second judgment unit judges that the magnetic field distortion is not present.

10. A system for detecting a state of a door of window, comprising:

the device according to claim 9; and the at least one sensor, which includes an acceleration sensor installed on the door or window and configured to generate the acceleration data;

an angular velocity sensor installed on the door or window and configured to generate the angular velocity data; and a magnetometer installed on the door or window and configured to generate the magnetometer data.

11. The device as claimed in claim 9, wherein:

when the second judgment unit judges that the magnetic field distortion is present, the state of the door or window is determined based on the angular velocity data, angular velocity deviation data, and an initial opening angle of the door or window, the processor further comprises a first updating unit configured to:

when the first judgment unit judges that the door or window is stationary at a current opening angle greater than zero and the second judgment unit judges that the magnetic field is not present, update the initial opening angle of the door or window; and set the initial opening angle of the door or window to zero when the state determining unit determines that the door or window is closed.

12. The device as claimed in claim 11, the processor further comprising:

a second updating unit configured to, when the first judgment unit judges that the door or window is stationary for a predetermined time period, update the angular velocity deviation data based on angular velocity data within the predetermined time period.

* * * * *